(12) United States Patent
Wilson

(10) Patent No.: US 7,095,240 B2
(45) Date of Patent: Aug. 22, 2006

(54) METHOD OF AN APPARATUS FOR TESTING WIRING

(75) Inventor: John Wilson, Bristol (GB)

(73) Assignee: Interface Technical Components Limited, Bristol (GB)

( * ) Notice: Subject to any disclaimer, the term of this patent is extended or adjusted under 35 U.S.C. 154(b) by 0 days.

(21) Appl. No.: 10/450,807

(22) PCT Filed: Dec. 11, 2001

(86) PCT No.: PCT/GB01/05478

§ 371 (c)(1),
(2), (4) Date: Oct. 17, 2003

(87) PCT Pub. No.: WO02/48723

PCT Pub. Date: Jun. 20, 2002

(65) Prior Publication Data

US 2005/0099170 A1    May 12, 2005

(30) Foreign Application Priority Data

Dec. 13, 2000 (GB) ................... 0030390.9

(51) Int. Cl.
*G01R 31/02* (2006.01)
*G01R 31/00* (2006.01)

(52) U.S. Cl. ...................... 324/539; 324/414

(58) Field of Classification Search ........ 324/403–414, 324/415, 418, 539; 340/641, 642; 307/31–35; 361/64

See application file for complete search history.

(56) References Cited

U.S. PATENT DOCUMENTS

| | | | | | |
|---|---|---|---|---|---|
| 4,155,036 | A | * | 5/1979 | Nicholson | 324/511 |
| 4,363,105 | A | * | 12/1982 | Plassmeier | 702/118 |
| 4,689,551 | A | * | 8/1987 | Ryan et al. | 324/539 |
| 4,721,899 | A | * | 1/1988 | Weil | 324/415 |
| 4,786,876 | A | * | 11/1988 | Graham | 324/551 |
| 4,807,277 | A | * | 2/1989 | Perry | 379/102.01 |
| 5,280,251 | A | * | 1/1994 | Strangio | 324/539 |
| 5,285,163 | A | * | 2/1994 | Liotta | 324/508 |
| 5,552,699 | A | | 9/1996 | Redmer | |
| 5,966,280 | A | * | 10/1999 | Cerminara et al. | 361/47 |
| 6,028,420 | A | * | 2/2000 | Benes | 323/276 |
| 6,054,865 | A | | 4/2000 | Bald et al. | |
| 6,072,317 | A | * | 6/2000 | Mackenzie | 324/536 |
| 6,087,834 | A | * | 7/2000 | Tury et al. | 324/414 |
| 6,538,577 | B1 | * | 3/2003 | Ehrke et al. | 340/870.02 |

FOREIGN PATENT DOCUMENTS

DE   19509831   12/1996
SU   141410   6/1988

* cited by examiner

*Primary Examiner*—Anjan Deb
*Assistant Examiner*—Jeff Natalini
(74) *Attorney, Agent, or Firm*—Gardere Wynne Sewell LLP

(57) ABSTRACT

A test system employing a plurality of disconnect devices is provided. Each load, such as a lamp, has a local disconnect device which temporarily disconnects the load in order to protect it from high voltage during the test.

17 Claims, 4 Drawing Sheets

METHOD OF AN APPARATUS FOR TESTING WIRING

CROSS REFERENCE TO RELATED APPLICATIONS

This application claims priority to International Application Number PCT/GB01/05478 filed Dec. 11, 2001, which claims the benefit of priority to Application Number 0030390.9 filed Dec. 13, 2000, in the United Kingdom.

BACKGROUND OF THE INVENTION

The present invention relates generally to the field of electrical wirings, and more specifically to a method of, and an apparatus for testing the safety of the electrical wiring within buildings.

United Kingdom wiring regulations in accordance with British Standard BS7679 requires that the electrical wiring within buildings must be regularly checked to determine whether or not the wiring meets certain minimum standards of safety. However, the period of time between which tests of the electrical wiring in a building must be carried out, are, in the majority of cases, not prescribed, except in respect of licensed premises and buildings which are open to members of the public. The requirements are often backed by the force of legislation, such as the Electricity at Work Act, the Health and Safety at Work Act and the Health and Safety Regulations in the United Kingdom.

Generally, good practice with regard to the period of time between which safety tests of the electrical wiring in buildings is carried out, is accepted as being between 7 and 8 years for domestic dwellings and 5 years for offices and commercial premises. However, those buildings or premises which are required to have a fire certificate must be tested annually. This includes licensed premises, hotels and buildings which are frequented by members of the public.

As one would expect, any failure to carry out regular tests of the safety of the electrical wiring in a building could lead to increase risk from of dangerous or unsafe electrical installations. Furthermore, any accidents, injuries or deaths that occur as a result of dangerous or faulty electrical installation, which has not undergone regular safety tests, may lead to the prosecution of those responsible. Prosecution resulting from a failure to carry out the prescribed safety tests could result in substantial fines, imprisonment or both in extreme cases.

Therefore, the regular testing of electrical wiring in buildings is important not only to maintain and ensure the safety of those persons frequenting such buildings, but it is also important in verifying that the subsequent installation or replacement of electrical components has been carried out properly, thereby helping to avoid or mitigate against the installation of dangerous or faulty electrical components which may lead to failure of the wiring at a later date.

Part of testing of the safety of electrical wiring involves proving or determining the integrity of the insulation of all the electrical conductors (i.e.—live, neutral and earth). British Standard BS7679 requires that the testing of the integrity of wiring insulation be carried out at a raised voltage of 1000 volts, in order to expose any potential weakness in any component of the electrical wiring insulation.

However, great difficulty is often encountered when such insulation integrity tests are conducted, especially on lighting circuits, due to the fact that modern light fittings are sensitive and are therefore often incapable of withstanding the increased voltage associated with the 1000 volt test prescribed in accordance with British Standard BS7679.

A further problem associated with carrying out the 1000 volt integrity test on lighting circuits, is that electronic circuits of modern fluorescent lights, discharge fittings and various other lighting components generate electrical leakage which may lead to false test readings, providing unsatisfactory test conditions and uncertain test results. As a result of these problems, it has been necessary for an electrician testing the lighting circuit to disconnect all of the light fittings in a circuit in order to carry out the test properly. This is a very laborious, time consuming and expensive task. Once the electrician has carried out the test he must then reconnect the lights and prove that they are all functioning correctly and safely after the test has been conducted. In many instances the testing of electrical circuits is made almost impossible due to the inaccessibility of lights as a result of mounting locations or access restrictions.

Furthermore, due to the fact that the testing of electrical wiring comprising lighting circuits is so labour intensive, time consuming and expensive, in many instances testing of electrical wiring is often not carried out properly or is not attempted at all, simply being ignored, having serious ramifications in terms of the integrity and safety of the wiring, and the associated safety of those persons frequenting such buildings.

SUMMARY OF THE INVENTION

According to a first aspect of the present invention there is provided a test system comprising a test module and a plurality of disconnect devices, each disconnect device being arranged to selectively disconnect at least one electrical load from wires supplying electricity to the at least one electrical load in response to a first disconnect signal in order that the integrity of the wires can be tested, each disconnect device being further arranged to reconnect the at least one load in response to a second signal, and said test module being arranged to check that all disconnect devices have disconnected before commencing a test.

One or more disconnect signal may be generated by the test module. The test module may be portable or may be provided as part of a building management system.

Preferably the disconnect devices are responsive to a disconnect signal supplied via a control line. The control line may run back to a control board.

As a further alternative, one or more control signals may be transmitted along the supply cables (wires under test) themselves. This makes retrofitting into existing buildings easier.

Many modern light fittings include controllers that support an addressable lighting interface. This interface may be used to control isolation devices, such as relays, in order to disconnect selected lamps. This interface may also be used to disconnect the lamp ballast such that the test can be performed.

The disconnect devices also enable the user to verify that the load are disconnected before he commences a test. Thus each disconnect device includes a signalling device that operates once the associated load has been disconnected. Each disconnect device may report independently that it has operated, the reports are ANDed or daisy chained such that each device within the plurality of devices that are grouped together must disconnect its load before an indication is given that all the loads are disconnected. However, in digital systems, the controller/test module may poll the disconnect devices to confirm that they have operated to disconnect the local load.

Advantageously each disconnect device may also give a local indication that it has disconnected its load. The indication may be visual or audible. Use of an LED is a preferred way of giving a local indication that the disconnection has occurred.

A further test for disconnection can be performed by supplying mains power along the cables that lead to the devices under test after the disconnect signal has been given. Any devices that are still operating clearly indicate that they have not disconnected. This can be monitored remotely by measurement of the load on the circuit. If the current being drawn exceeds a threshold whose value is substantially that of the smallest (least power consuming) device on the circuit, then it can be inferred that at least one device has not disconnected correctly.

Additionally or alternatively the device may respond to a signal transmitted via radio (including bluetooth-RTM), infrared or ultrasound to cause a disconnect to occur. Instructions to disconnect may also be transmitted over the wires under test. The reconnect can then occur after a predetermined period of time or after the transmission of a reconnect signal. In such circumstances a control circuit may monitor the wires for signals. However a reconnect signal may, in some circumstances merely be the absence of a disconnect signal.

The disconnect devices may be battery powered and/or may derive their power from the mains supply or from a remote DC supply, which may be derived from the mains or may be a battery. Short term storage may be provided to operate the disconnect devices during the disconnect test.

Preferably the disconnect device includes at least one relay for disconnecting the load. The load may comprise one or more lights.

In a preferred embodiment, each disconnect device may be remotely controlled by a control module, comprising a battery and/or charging means, and a switch which when closed supplies a disconnect signal causing the disconnect device to be activated. The control module also comprises a means for verifying that all the disconnect devices have activated. Said verification means may comprise an LED which when lit indicates that all the disconnect devices have been activated and that all the loads have been disconnected prior to carrying out testing of the wires. A fail safe function is therefore included such that a test cannot be performed until all the disconnect devices have operated.

According to a second aspect of the present invention there is provided a method of testing lights connected to a power supply via a test system according to the first aspect of the present invention, the test comprising the steps of asserting a disconnect signal to disconnect the lights, confirming that all the lights have disconnected, performing at least a test of the insulation or continuity, supplying power to the lights and reconnecting the lights.

Those skilled in the art will further appreciate the above-mentioned advantages and superior features of the invention, together with other important aspects thereof upon reading the detailed description that follows in conjunction with the drawings.

BRIEF DESCRIPTION OF THE DRAWINGS

For more complete understanding of the features and advantages of the present invention, reference is now made to the detailed description of the invention along with the accompanying FIGURES, wherein.

DETAILED DESCRIPTION OF THE INVENTION

Although making and using various embodiments of the present invention are discussed in detail below, it should be appreciated that the present invention provides many inventive concepts that may be embodied in a wide variety of contexts. The specific aspects and embodiments discussed herein are merely illustrative of ways to make and use the invention, and do not limit the scope of the invention.

Figure 1:
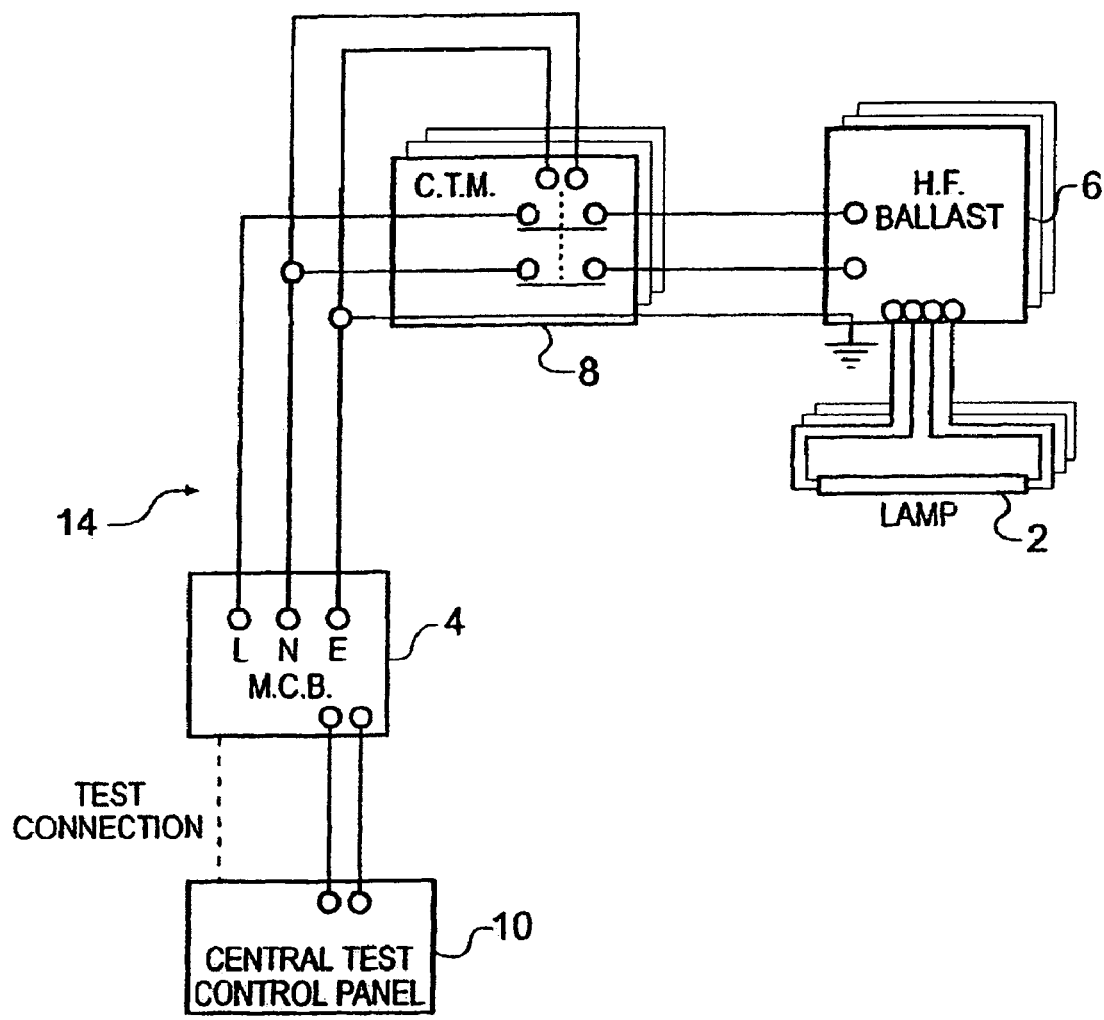
FIG. 1 schematically depicts the configuration of a test circuit in which signals to the disconnect device are provided along the wires under test.

FIG. 1 depicts the supply arrangement for a fluorescent lamp, generally indicated 2. The lamp receives a mains electricity supply from the building supply rails (not shown) that, in turn, are connected to the supply input of a circuit breaker 4. The "live", "neutral" and "earth" supplies are then output from the circuit breaker 4 and are connected to a high frequency ballast unit 6 of the lamp 2. Interposed between the circuit breaker 4 and the ballast unit 6 is a disconnect device 8. The disconnect device 8 includes switching means, such as relays, operable to disconnect the live and neutral supplies to the ballast 6. Optionally, they may also be operable to disconnect the earth connection. In the arrangement shown, the disconnect unit 8 receives a control signal which is carried on the neutral and earth conductors of the circuit under test. Use of the neutral and earth conductors are advantageous since both of these should be at approximately 0 volts in use. However, it is also possible to encode the control data on the live conductor if necessary.

A control test panel 10 is provided which has a test connection to the circuit breaker 4. This allows the control test panel 10 to generate the disconnect signal and to superimpose it onto the appropriate ones of the conductors under test in order that the signal can be supplied to the disconnect device 8.

Multiple disconnect devices having associated lamps may be run in parallel off the main supply. When this is done, it may be desirable to add a daisy chained test line running from device to device such that a signal can be generated confirming that each and every device has operated to disconnect its associated lamp.

In use, the control test panel sends a signal to the disconnect device 8 in order to cause it to disconnect the lamp and ballast 2 and 6 respectively, from the mains supply. Optionally the control test panel may also send a signal to the circuit breaker in order to cause it to disconnect its circuit from the mains supply. The conductors, generally indicated 14, can then be subjected to the high voltage insulation test in order to confirm their reliability.

Figure 2:
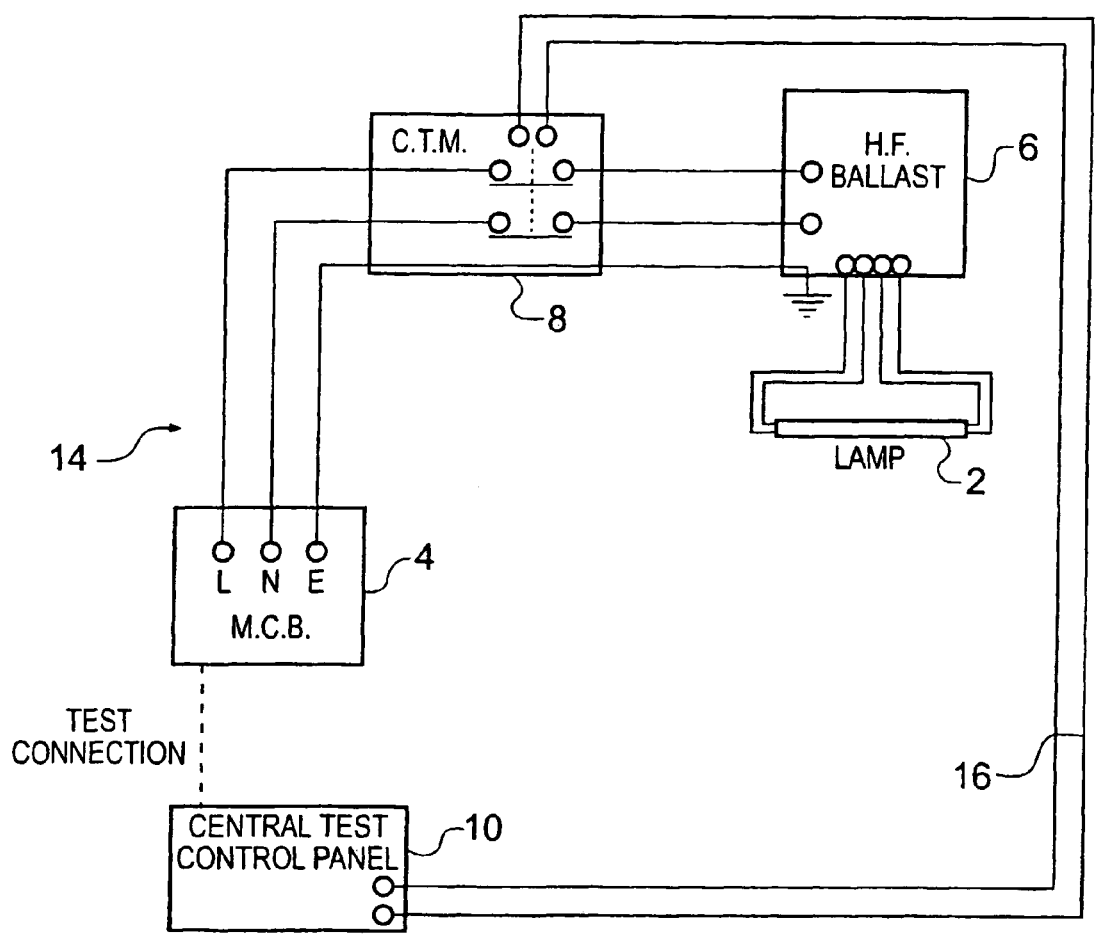
FIG. 2 schematically depicts an arrangement in which the signals to the disconnect device are provided along dedicated control wires.

FIG. 2 shows an arrangement similar to that shown in FIG. 1, except now the control signals to the disconnect device 8 are provided along dedicated control lines 16. This removes the necessity to superimpose the disconnect and reconnect signals onto the wires under test. This has the advantage in that the control circuitry for the disconnect device does not have to be designed to withstand the high test voltages which are used.

Figure 3:
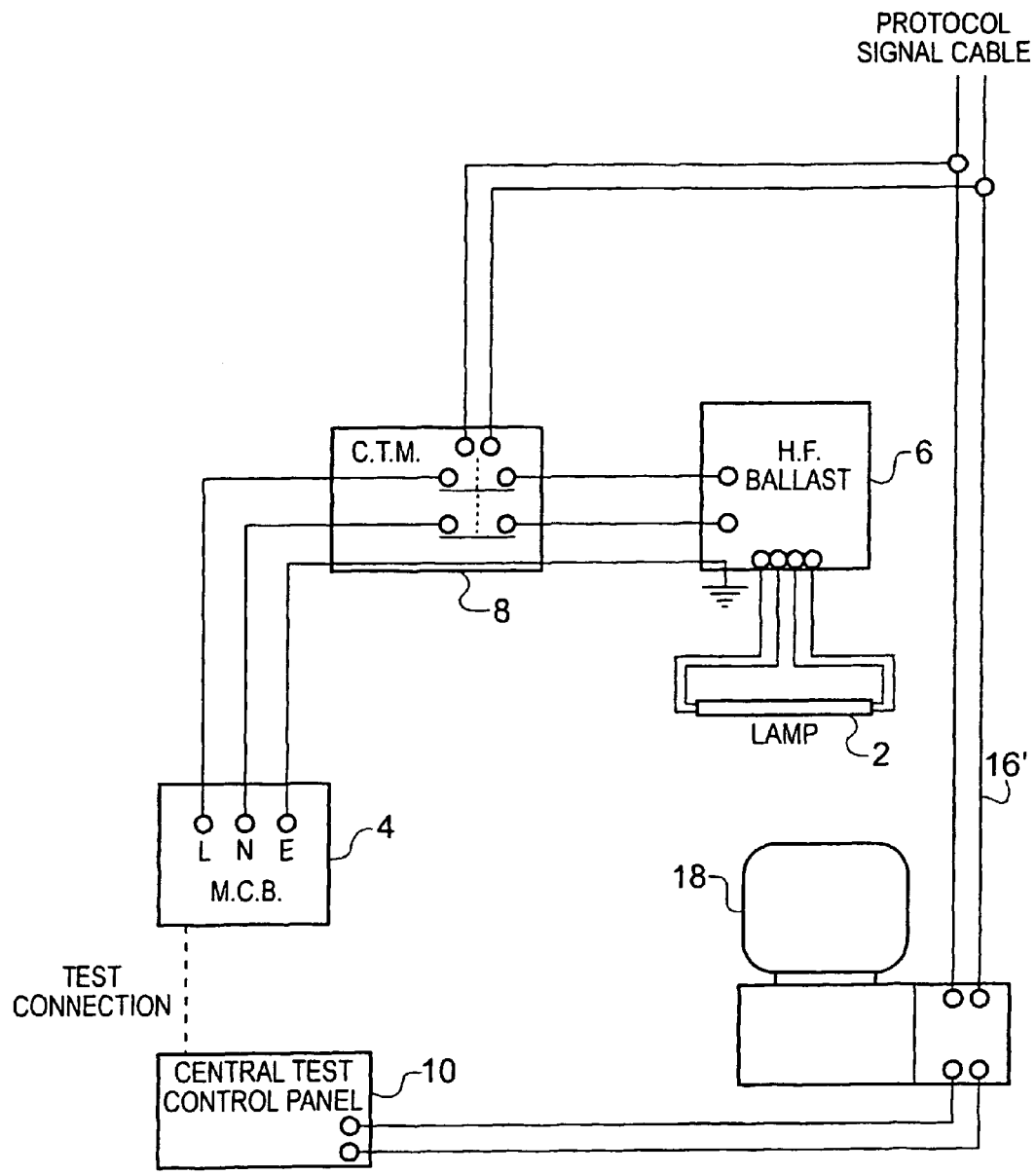
FIG. 3 schematically depicts a test arrangement according to an embodiment of the present invention in which signals to the disconnect device are provided along control signal wires which may be provided as part of an addressable lighting control system.

FIG. 3 shows an embodiment of the present invention that comprises an arrangement similar to that shown in FIG. 2, except that the disconnect device 8 is now connected to a control signal bus 16' which itself is interfaced to a building management system 18 which may receive an input from the control panel 10 or which may have the control panel 10 integrated therein. The bus 16' may be a data bus of a recognised standard, such as the digital addressable lighting interface (DALI) or European information bus (EIB) protocols. Thus individual disconnect devices 8 may be addressed on the bus to selectively connect and disconnect. Thus, not only can the building management system 18 instruct the devices to disconnect, but providing the disconnect devices 8 also support bi-directional communication it may then poll each individual device to confirm that the disconnect has indeed occurred. The test may then be performed only when all of the devices confirm that they have successfully disconnected.

Figure 4:
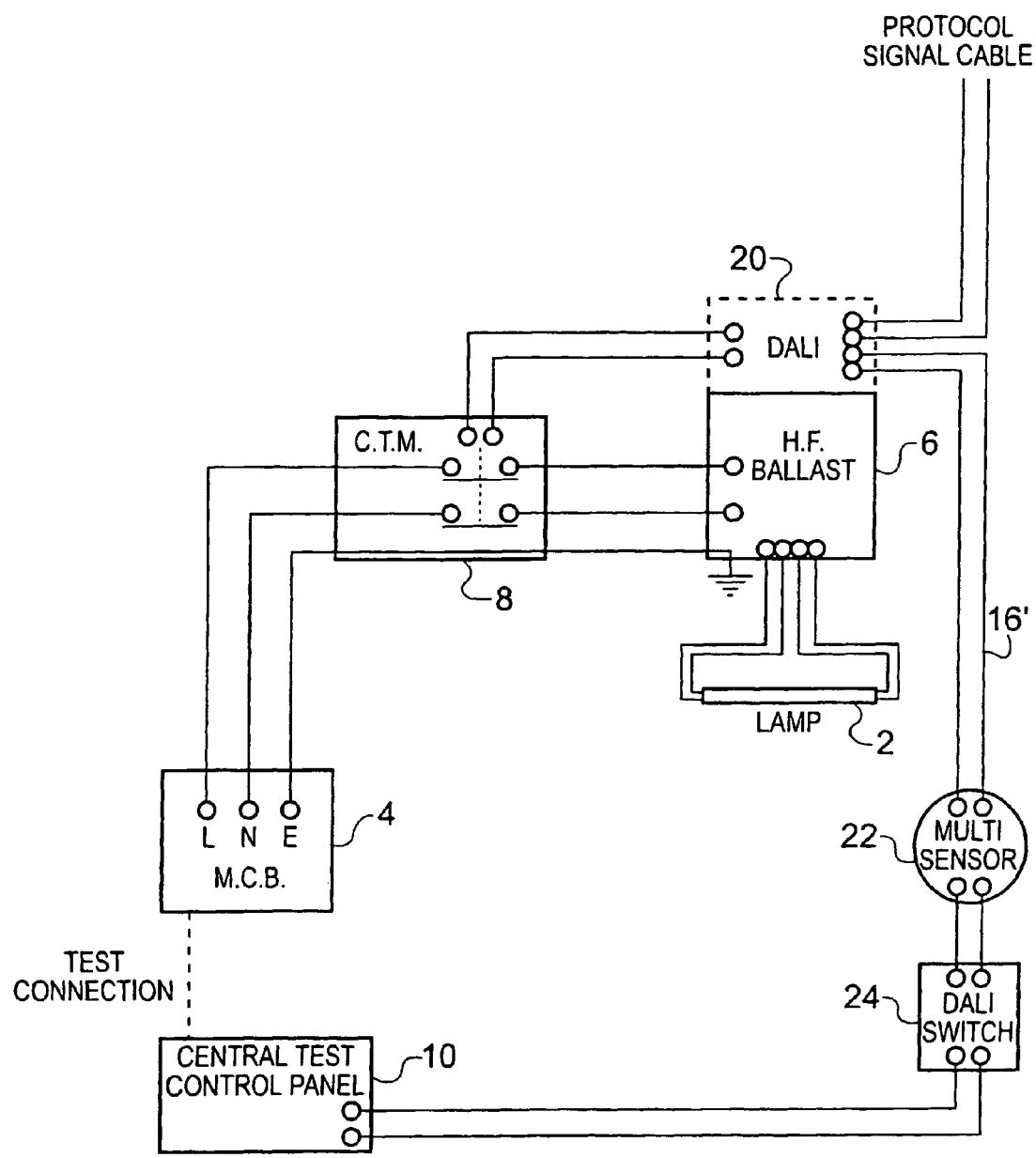
FIG. 4 depicts an arrangement similar to that shown in FIG. 3.

FIG. 4 illustrates an arrangement similar to that shown in FIG. 3, but wherein each ballast unit 6 has a DALI interface 20 associated therewith such that the lamp brightness can be controlled by suitable control of the high frequency ballast. A multisensor 22 and a switch 24 are provided such that the control test panel 10 can be selectively connected to the DALI bus 16' and such that the results from the tests can be picked off from the bus and routed to a data acquisition unit.

It is thus possible to provide a lighting test system.

In a modification of the invention, wireless communication may be provided between the control unit or each disconnect device. Thus each disconnect device would require at least a local receiver and optionally a local transmitter in order that it can signal to the control device that it has disconnected its load. Constructional details of transmitters and receivers are within the scope the person skilled in the art and need not be described here in detail. It is expected that such transmitters could be bluetooth (RTM) devices.

Each disconnect device 8 may remain permanently disconnected until such time as it receives a reconnect signal, or alternatively it may be arranged to reconnect after a predetermined time as lapsed. The mode of operation may be freely selected by the user.

Additional objects, advantages and novel features of the invention as set forth in the description that follows, will be apparent to one skilled in the art after reading the foregoing detailed description or may be learned by practice of the invention. The objects and advantages of the invention may be realized and attained by means of the instruments and combinations particularly pointed out herein.

What is claimed is:

1. A test system comprising:
a plurality of disconnect devices and a test module arranged to be in communication with each of the plurality of disconnect devices, wherein each disconnect device is arranged to selectively remove at least one electrical load from connection between supply wires supplying electricity to the at least one electrical load in response to a first disconnect signal provided by the test module in order that the integrity of the wires can be tested, each disconnect device being further arranged to reconnect the at least one load in response to a second signal, and wherein the test module is arranged to check that all of the loads have been removed from connection between the supply wires before commencing a test.

2. The test system of claim 1, wherein the second signal is generated by the test module.

3. The test system of claim 2, wherein the test module is portable.

4. The test system of claim 2, wherein the test module is part of a building management system.

5. The test system of claim 1, wherein each disconnect device is responsive to a disconnect signal supplied via a control line.

6. The test system of claim 1, wherein each disconnect device is responsive to a control signal transmitted along the wires under test.

7. The test system of claim 1, wherein each disconnect device includes a local signaling device that operates once the load has been disconnected.

8. The test system of claim 7, wherein the load signaling device is an LED.

9. The test system of claim 1, wherein each disconnect device can be polled in order to determine its status.

10. The test system of claim 1, wherein each disconnect device is arranged to reconnect the load after a predetermined period of time.

11. The test system of claim 1, wherein each disconnect device is arranged to reconnect the load upon receipt of a reconnect signal.

12. The test system of claim 1, wherein each disconnect device is arranged to reconnect the load in response to the absence of the disconnect signal.

13. The test system of claim 1, wherein each disconnect device is powered, wherein the power is selected from the group consisting of a battery, a main supply, a remote DC supply, and combinations thereof.

14. The test system of claim 1, wherein communication between the test module and the disconnect devices is via wireless transmission.

15. The test system of claim 1, wherein said electrical load comprises a lighting device.

16. A method of testing wiring to lights connected to a power supply via a test system comprising a plurality of disconnect devices and a test module arranged to be in communication with each of the plurality of disconnect devices, each disconnect device being arranged to selectively remove at least one electrical load from connection between supply wires supplying electricity to the at least one electrical load in response to a first disconnect signal provided by the test module in order that the integrity of the wires can be tested, each disconnect device being further arranged to reconnect the at least one load in response to a second signal, wherein said test module is arranged to check that all of the loads have been removed from connection between the supply before commencing a test, the test comprising:
asserting a disconnect instruction to disconnect the lights;
confirming that all lights have disconnected;
performing at least a test of continuity; and
reconnecting the lights.

17. A method of testing wiring to lights connected to a power supply via a test system comprising a plurality of disconnect devices and a test module arranged to be in communication with each of the plurality of disconnect devices, each disconnect device being arranged to selectively remove at least one electrical load from connection between power supply wires supplying electricity to the at least one electrical load in response to a first disconnect signal provided by the test module in order that the integrity of the wires can be tested, each disconnect device being further arranged to reconnect the at least one load in response to a second signal, wherein said test module is arranged to check that all of the loads have been removed from connection between the supply wires before commencing a test, the test comprising:

asserting a disconnect instruction to disconnect the lights;
confirming that all lights have disconnected;
performing at least a test of insulation; and
reconnecting the lights.

* * * * *